United States Patent [19]
Tomigashi et al.

[11] Patent Number: 5,285,946
[45] Date of Patent: Feb. 15, 1994

[54] APPARATUS FOR MOUNTING COMPONENTS

[75] Inventors: Yoshio Tomigashi, Higashiosaka; Yoshitoshi Morita, Kawanishi; Masahiko Hashimoto, Toyonaka; Akira Sakaguchi, Kobe; Michio Kunimitsu, Hirakata, all of Japan

[73] Assignee: Sanyo Electric Co., Ltd., Osaka, Japan

[21] Appl. No.: 958,636

[22] Filed: Oct. 9, 1992

[30] Foreign Application Priority Data

| Oct. 11, 1991 | [JP] | Japan | 3-263400 |
| Oct. 11, 1991 | [JP] | Japan | 3-263401 |
| Nov. 25, 1991 | [JP] | Japan | 3-308703 |
| Mar. 19, 1992 | [JP] | Japan | 4-63236 |
| Jul. 28, 1992 | [JP] | Japan | 4-201154 |

[51] Int. Cl.⁵ .................................... H01L 21/603
[52] U.S. Cl. .................................... 228/9; 228/6.2; 228/102
[58] Field of Search .............. 228/102, 180.2, 106, 228/4.1, 5.5, 6.2, 8, 9; 156/358

[56] References Cited

U.S. PATENT DOCUMENTS

| 4,605,833 | 8/1986 | Lindberg | 228/9 |
| 4,631,685 | 12/1986 | Peter | 228/9 |
| 4,993,618 | 2/1991 | Toyozawa et al. | 228/102 |
| 5,065,933 | 11/1991 | Basavanhally | 228/9 |
| 5,113,581 | 5/1992 | Hidese | 228/6.2 |

FOREIGN PATENT DOCUMENTS

| 60-66500 | 4/1985 | Japan |
| 63-22292 | 1/1988 | Japan |
| 63-232496 | 9/1988 | Japan |
| 1-246899 | 10/1989 | Japan |

Primary Examiner—Samuel M. Heinrich
Attorney, Agent, or Firm—Armstrong, Westerman, Hattori, McLeland & Naughton

[57] ABSTRACT

An apparatus for mounting electronic components on the surface of printed boards by a suction head assembly 4 coupled to a head lift mechanism comprises a force sensor 6 for measuring the pressure exerted on the component by a mounting operation, and a microcomputer 1 for preparing a control signal in accordance with the deviation of the value measured by the force sensor from a desired value of pressure on the component. The rotation of a head lifting motor 51 is controlled based on the control signal.

6 Claims, 16 Drawing Sheets

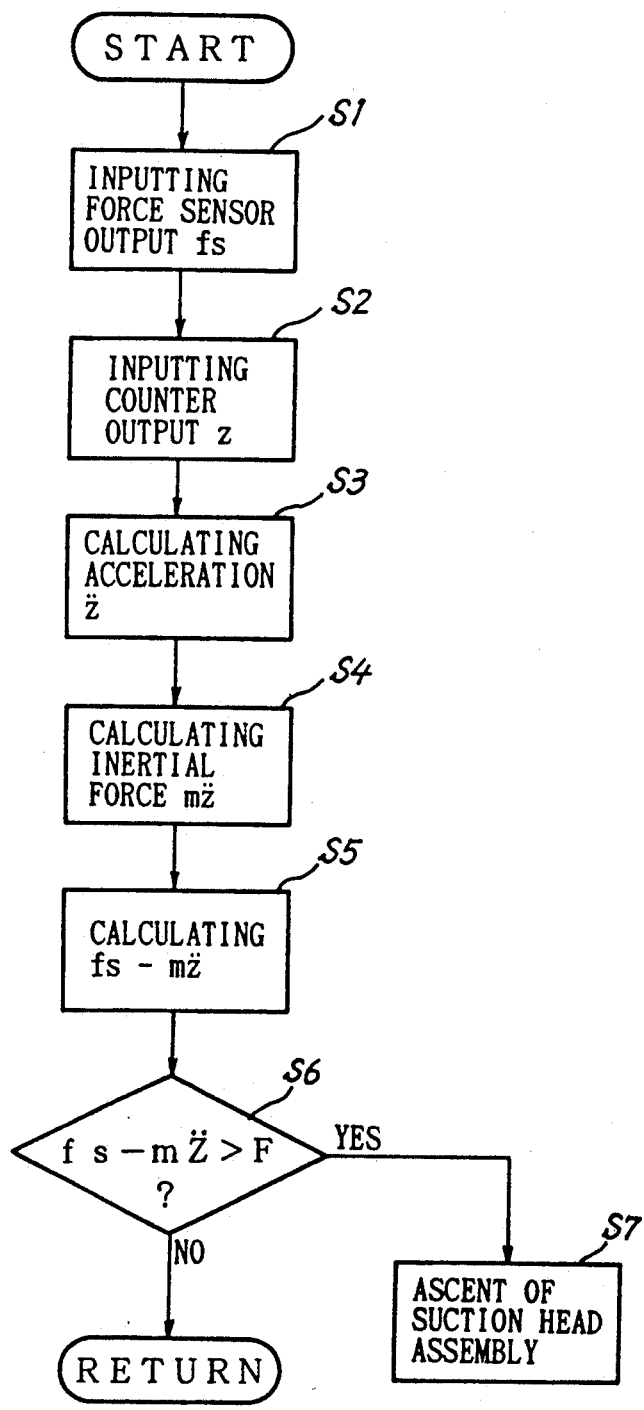

APPARATUS FOR MOUNTING COMPONENTS

FIELD OF THE INVENTION

The present invention relates to apparatus for use with various components which are not resistant to external forces, such as semiconductor chips or like electronic components, and minute chips or like parts made of fragile material, for mounting such components in position on the surface of printed boards or the like, and more particularly to apparatus for mounting components on a surface reliably without breaking the component.

BACKGROUND OF THE INVENTION

Conventional apparatus for automatically mounting electronic components in position on the surface of printed boards have a suction head assembly provided with a suction nozzle for attracting thereto the electronic component by a vacuum. The suction head assembly is mounted on a reciprocating device which is controllable to move in the directions of X-axis, Y-axis and Z-axis.

When the above apparatus is used for surface mounting, the suction head assembly is first moved to a component feed portion of an electronic component feeder, the suction nozzle is caused to attract the electronic component thereto by a vacuum, and the component is thereafter moved to a position above a printed board, whereupon the assembly is lowered to place the component in position on the surface of the board.

When the component is brought into contact with the printed board, the suction head assembly is further driven downward, whereby the component is pressed against a bonding layer or solder paste layer on the board surface and fixed or temporarily fixed to the board.

The suction head assembly is thereafter returned to above the component feeder, followed by the subsequent cycle of surface mounting operation.

With the conventional surface mounting apparatus, the upward and downward movement of the suction head assembly is effected by operating a cam mechanism. The cam curve of the cam mechanism is so designed that an excessive impact force or pressure will not act on electronic components when the suction nozzle is pressed against the component on the feeder and also when the attracted component is pressed against the printed board.

In recent years, however, a wide variety of electronic components are introduced into use which differ variously in configuration, size (thickness) and material. These components include, for example, delicate parts such as IC (LSI) bear chips. The electronic components to be mounted by the surface mounting apparatus therefore differ greatly in mechanical properties with the type of components.

Accordingly, in mounting different types of electronic components by the surface mounting apparatus, the pressure to be exerted on the component when the component is held by suction and when it is mounted on the surface must be controlled to a suitable value for each of the different types.

The suction head assemblies already proposed for use in surface mounting apparatus include, for example, those which are driven by a linear motor (Unexamined Japanese Patent Publications SHO 60-66500 and SHO 63-232496), those which are driven by a compression spring (Unexamined Japanese Patent Publication SHO 63-22292) and those wherein electropneumatic regulator is utilized (Unexamined Japanese Patent Publication HEI 1-246899).

However, the apparatus wherein the linear motor is used for driving has the problem that the apparatus is complex in construction and has a great weight. With the apparatus wherein the compression spring or electropneumatic regulator is used, it is difficult to accurately control the pressure or impact force to be actually exerted on the electronic component.

Further in the case of electronic components which are not resistant to impact forces, the force of impact to be produced by the striking contact of the component with the printed board must be limited to not greater than a specified value.

Nevertheless, the value of impact force permissible for components is not definite for all components, whereas the suction head assembly is conventionally lowered at a suitable speed which is empirically determined. This entails the problem that an excessive impact force is likely to act on some components to shorten the life of the component or break the component.

The lowering speed, if set to a very low value, results in a poor work efficiency and is not practical.

SUMMARY OF THE INVENTION

An object of the present invention is to provide a component mounting apparatus which has a simple construction and is capable of accurately controlling the pressure to be exerted on the components to be handled.

The present invention provides a pressure control system for a component mounting apparatus which system comprises desired value setting means for setting a desired value of pressure to be exerted on components, measuring means for measuring the pressure exerted on the component by an actual mounting operation, and drive control means for driving a pressure mechanism in accordance with the deviation of the measured value from the desired value of pressure.

The component mounting apparatus for the surface mounting of electronic components comprises a suction head assembly for holding the component by suction, and a reciprocating device for reciprocatingly moving the suction head assembly toward a printed board. The reciprocating device constitutes the pressure mechanism.

The desired value of pressure set by the desired value setting means is in a steplike waveform, or a ramplike waveform or waveform of first-order lag wherein rising pressure gradually increases toward a final desired value.

The pressure control system of the component mounting apparatus embodying the invention is realized, for example, by a feedback control system for controlling the pressure mechanism according to the detected value of pressure.

When the component on a surface is pressed against the surface and bonded thereto by the apparatus, the pressure acting on the component increases in accordance with the desired value input and having, for example, the steplike waveform, and the variations in the pressure are detected until the desired value is reached.

The deviation of the detected pressure from the desired value is calculated, and a control signal in accordance with the deviation is fed back to the pressure mechanism in real time to control the pressure.

As a result, the pressure is controlled to a value close to the desired value to the greatest possible extent, whereby the component is protected from damage or break due to the action of excessive pressure.

When the ramplike waveform or waveform of first-order lag is set as the desired value of pressure, the pressure on the component increases moderately and is prevented from overshooting even in the case where the component or the surface for mounting the component thereon is made of a very hard material.

The pressure control system of the mounting apparatus has a simple construction, that is, the system merely comprises a feedback control system having the pressure measuring means and is nevertheless capable of accurately restricting the pressure to be exerted on the components to be handled.

Another object of the present invention is to provide an impact force control system for use in the component mounting apparatus for reliably preventing components from being damaged or broken by determining a suitable speed of collision.

The impact force control system for use in the component mounting apparatus of the invention is adapted to control the speed of collision of the component with the surface for mounting the component thereon, whereby the impact force to be exerted on the component is regulated to not greater than a specified value. The system measures the impact force produced by an actual mounting operation, analyzes the correlation between the speed of collision and the impact force from the data of measurement and determines from the correlation the speed at which collisions are to occur subsequently.

The speed of collision which produces the impact force to be measured first is set to a suitable value in advance according to the type of components to be mounted so that the impact force will be sufficiently lower than a permissible limit of impact force. This obviates the likelihood of components becoming damaged.

Since the speed of collision and the impact force are generally in a proportional relation, the coefficient of proportion of the speed to the force can be determined from the measurement data (as to the speed of collision and impact force) obtained at at least one point.

For the subsequent mounting operation, therefore, a suitable speed of collision in accordance with the limit of impact force which will not damage or break components is determined based on the coefficient of proportion obtained by the first mounting operation or on a coefficient of proportion obtained from data accumulated by cycles of mounting operation.

The impact force control system of the component mounting apparatus analyzes the correlation between the speed of collision and the impact force, which differs for different types of components, based on the measurement data, determines an appropriate speed of collision and accordingly maintains a high speed of mounting operation while reliably preventing damage to or break of components.

Another object of the present invention is to provide a component mounting apparatus which has a suction nozzle and in which the external force to be exerted on the suction nozzle can be measured accurately so as to reliably preclude damage to or break of the suction nozzle.

The component mounting apparatus of the present invention comprises a reciprocating mechanism having an output portion and movable toward and away from a surface for mounting components thereon, and a component holding mechanism attached to the output portion, the component holding mechanism having a base portion fixed to the output portion of the reciprocating mechanism, a component holding head portion coupled to the base portion and movable relative thereto in the direction of movement of the reciprocating mechanism, an elastic connecting portion connecting the base portion to the component holding head portion, and a displacement sensor provided between the base portion and the holding head portion for measuring the displacement of the base portion and the head portion relative to each other.

The component mounting apparatus has an external force measuring circuit which comprises force detecting means for detecting the force to be exerted on the component holding head portion based on the output value of the displacement sensor and the elastic modulus of the elastic connecting portion, and arithmetic means for calculating an external force acting on the component holding head portion by subjecting the result of detection by the force detecting means to a correcting arithmetic operation taking account of at least the acceleration of the output portion of the reciprocating mechanism and the mass of the component holding head portion, while the component holding head portion of the holding mechanism approaches the surface.

The value detected by the force detecting means includes the external force acting on the holding head portion and the inertial force of the head portion.

It therefore follows that the external force acting on the holding head portion is obtained by causing the arithmetic means to subtract the inertial force of the holding head portion from the value detected by the detecting means. An approximate value of the inertial force of the holding head portion can be obtained, for example, by multiplying the mass of the holding head portion by the acceleration of the output portion of the reciprocating mechanism.

The external force acting on the component holding head portion (suction nozzle) can be measured accurately by the external force measuring circuit of the mounting apparatus, whereby the suction nozzle is reliably prevented from being damaged.

Still another object of the present invention is to provide an apparatus for automatically mounting electronic components, whereby the force to which the component is to be subjected when it is mounted on a board can be set to a predetermined value accurately.

The apparatus for automatically mounting electronic components according to the invention comprises a reciprocating mechanism having an output portion and movable toward and away from a surface for mounting the component thereon, and a component holding mechanism attached to the output portion, the component holding mechanism comprising a base portion fixed to the output portion of the reciprocating mechanism, a movable portion in engagement with the base portion and movable relative thereto in the direction of reciprocating movement, a spring member provided between the base portion and the movable portion, a component holding head portion connected to the movable portion by an elastic support member elastically deformable toward the direction of reciprocating movement, and a strain sensor for measuring the amount of elastic deformation of the elastic support member.

When the component holding mechanism is lowered by the operation of the reciprocating mechanism to press an electronic component, as held by the holding head portion, against a board, the movable portion moves relative to the base portion, compressing the spring member and elastically deforming the support member, whereupon the amount of elastic deformation is measured by the strain sensor.

The repulsive force of the spring member presses the electronic component against the board.

The amount of elastic deformation of the elastic support member is in a definite corresponding relation with the force exerted by the board on the electronic component held by the holding head portion. Furthermore, the impact force produced by the collision of the electronic component with the board immediately appears as an amount of elastic deformation.

Accordingly, the force to be actually exerted on the electronic component can be set to a predetermined value by controlling the operation of the reciprocating mechanism based on the output of the strain sensor.

With the automatic mounting apparatus described, the force to which the electronic component is to be subjected when it is mounted on the board can be accurately set to a predetermined value. This precludes damage or break of the electronic component and mounting operation errors.

BRIEF DESCRIPTION OF THE DRAWINGS

FIG. 16 is a flow chart showing an external force measuring procedure in position control;

DETAILED DESCRIPTION OF EMBODIMENTS

Surface Mounting Apparatus

FIGS. 4 to 8 specifically show the construction of an electronic component surface mounting apparatus embodying the invention. First, the mechanism of the apparatus will be described.

Figure 4:
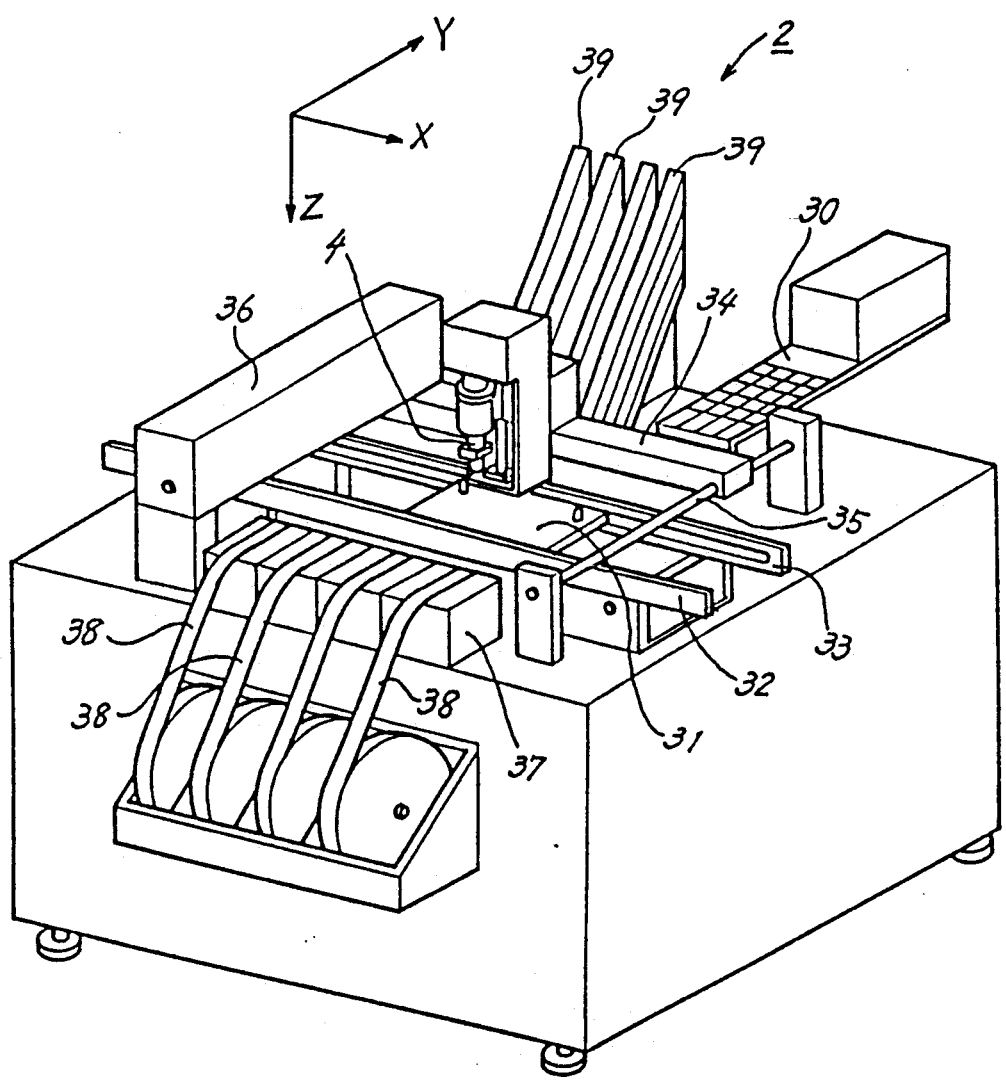
FIG. 4 is a perspective view showing the appearance of the surface mounting apparatus.

As shown in FIG. 4, the surface mounting apparatus 2 has mounted on a frame a pair of conveyors 32, 33 for transporting printed boards 31, and a tray 30 for placing electronic components thereon. Arranged on opposite sides of the pair of conveyors 32, 33 are a tape feeder unit 37 for feeding electronic components taped as at 38 intermittently by one pitch at a time, and magazines 39 for containing electronic components as stacked up vertically.

A suction head assembly 4 for holding the electronic component thereto by suction is moved in an X-axis direction and Y-axis direction by an X-Y table, which has a pair of Y-axis guides 35, 36 mounted on the frame and extending in the Y-axis direction, and an X-axis guide 34 slidably in engagement with the guides and drivable in the Y-axis direction. The suction head assembly 4 is mounted on the X-axis guide 34 and reciprocatingly movable in the X-axis direction.

Figure 5:
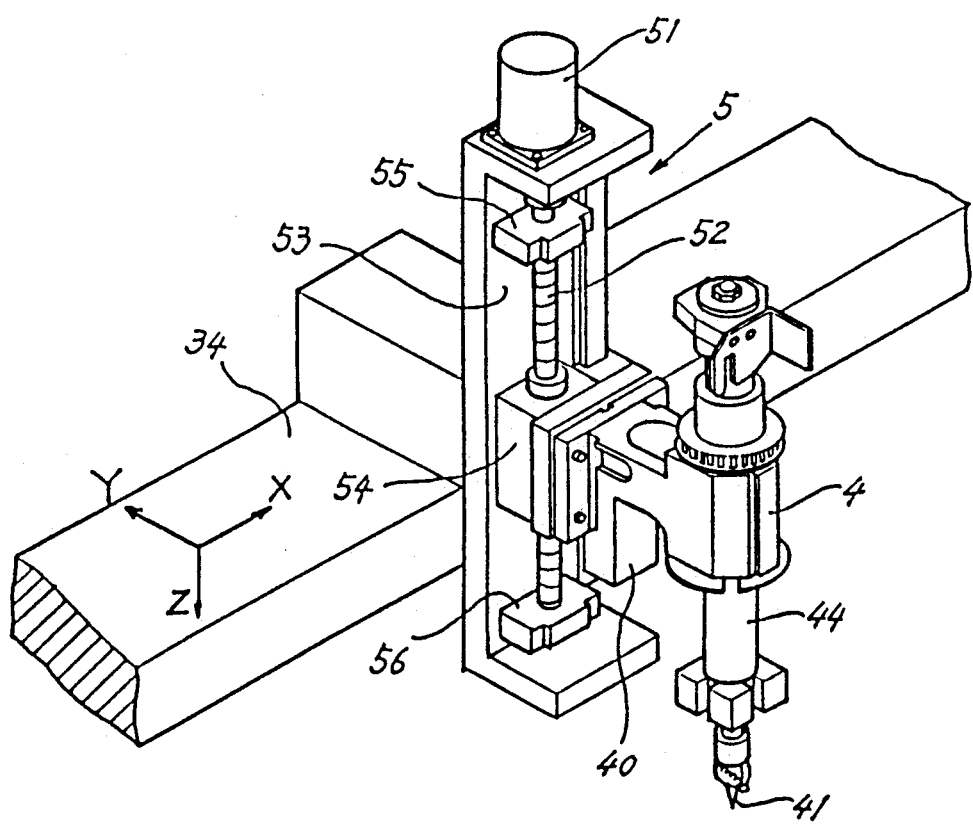
FIG. 5 is a perspective view showing the appearance of a suction head assembly attached to a head lift mechanism.

As seen in FIG. 5, the suction head assembly 4 is held to the X-axis guide 34 by a head lift mechanism 5.

The head lift mechanism 5 comprises a Z-axis guide 53 slidably in engagement with the X-axis guide 34 and having a ball screw 52 vertically supported by a pair of bearings 55, 56 on the Z-axis guide 53.

In screw-thread engagement with the ball screw 52 is a lift block 54 slidably in engagement with the Z-axis guide 53 and movable upward and downward by being guided by the screw 52.

A motor 51 mounted on the Z-axis guide 53 is connected to the upper end of the ball screw 52. The lift block 54 has fixed thereto a support arm 40 projecting from the suction head assembly 4.

Accordingly, the ball screw 52, when rotated by the operation of the motor 51, drives the lift block 54 upward or downward by screw thrust to move the assembly 4 upward or downward therewith.

Figure 6:
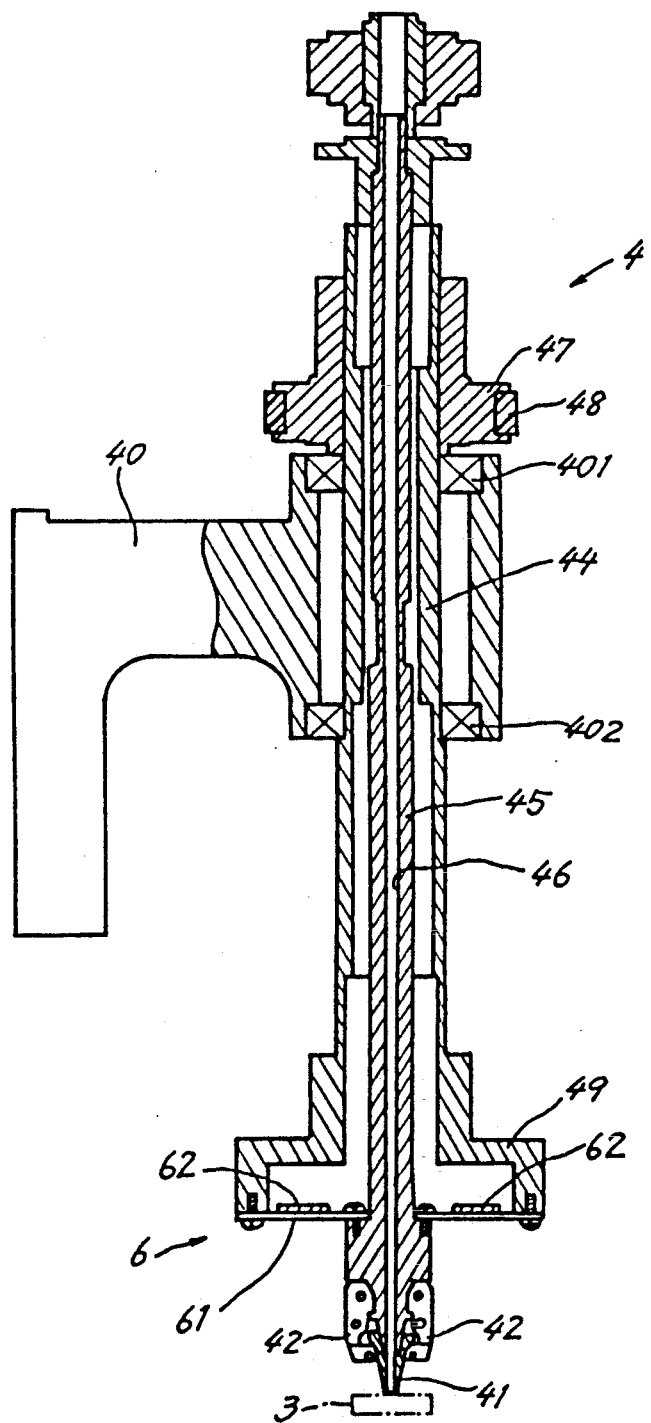
FIG. 6 is a sectional view of the suction head assembly.

With reference to FIG. 6, the suction head assembly 4 comprises an outer tube 44 vertically supported by bearings 401, 402 on the support arm 40, and an inner tube 45 disposed inside the outer tube 44 in engagement therewith so as to be movable axially of the outer tube 44 but nonrotatable relative thereto.

The inner tube 45 has a center bore 46 communicating with an unillustrated vacuum pump. A pair of clamp arms 42, 42 is attached to the lower end of the inner tube 45 for holding a suction nozzle 41 by clamping.

Figure 7:
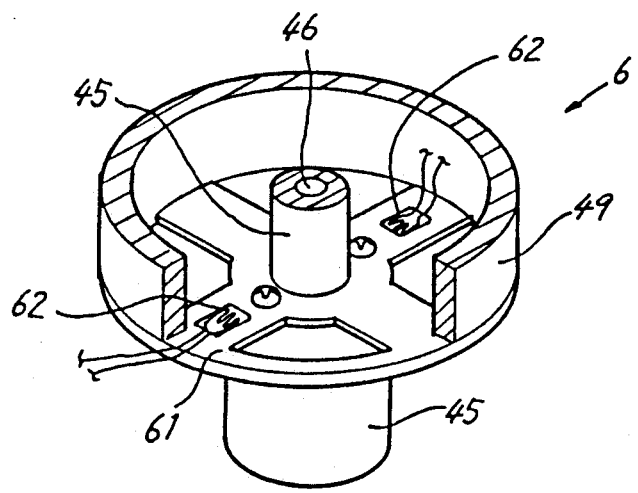
FIG. 7 is a perspective view partly broken away and showing the construction of a force sensor.

A drum member 49 integral with the lower end of the outer tube 44 has an open end, which is provided with a disklike spring member 61 fastened to its outer peripheral portion with screws as shown in FIG. 7. The disklike spring member 61 has its inner peripheral portion fastened to the inner tube 45 with screws. Strain gauges 62, 62 are affixed to a surface of the spring member 61 to constitute a force sensor 6 for measuring an impact force or pressure on electronic components as will be described later.

Figure 8:
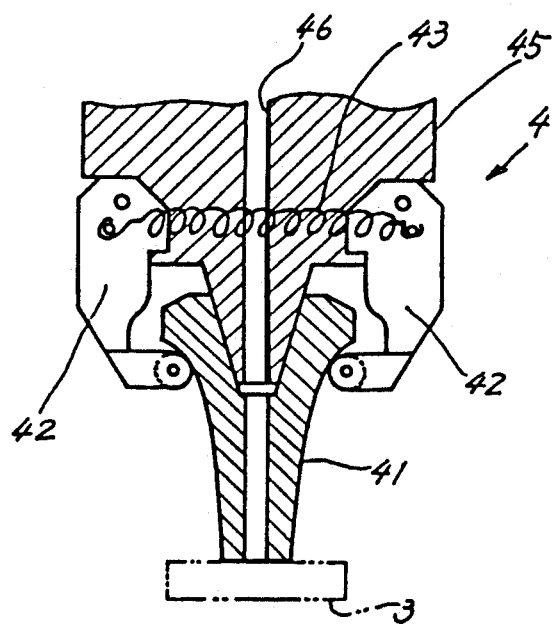
FIG. 8 is an enlarged view in section of a nozzle portion of the suction head assembly.

As shown in FIG. 8, the pair of clamp arms 42 is pivoted to the lower end of the inner tube 45, and a spring 43 is connected between the two arms. Thus, the suction nozzle 41 is removably held clamped by the arms 42, 42 with its nozzle orifice in communication with the center bore 46 of the inner tube 45.

As shown in FIG. 6, the outer tube 44 is provided with a pulley 47 which is driven by a timing belt 48. The outer tube 44 is rotated through a predetermined angle by an unillustrated drive mechanism to orient an electronic component 3 held by the suction nozzle 41 in a desired direction.

Control Unit

Figure 1:
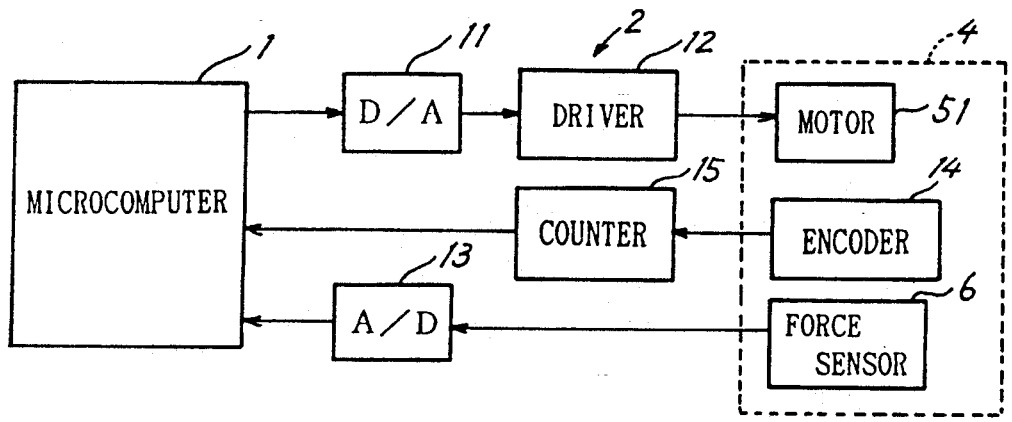
FIG. 1 is a block diagram showing a motor drive system of a surface mounting apparatus embodying the invention.

The surface mounting apparatus 2 described has its operation controlled by a microcomputer 1 shown in FIG. 1. To control the lift drive motor 51 of the apparatus 2, the output signal of the force sensor 6 provided by the strain gauges 62 is fed via an A/D converter 13 to the microcomputer 1, which in turn prepares a motor control signal. This signal is sent through a D/A converter 11 to a motor driver 12, whereby the rotation of the motor 51 is controlled.

The signal obtained by the A/D converter is displacement data representing the amount of deformation of the strain gauges 62. The displacement data is processed by the microcomputer 1 to detect the force acting on the electronic component 3.

The motor 51 is controlled in the following manner based on the detection signal from the force sensor 6. The control process for the motor 51 comprises two procedures, i.e., a preceding procedure of speed control and subsequent procedure of force control which are exectued before and after the time when the electronic component 3 collides with the surface of the printed board 31 to produce an impact force.

Speed Control

Figure 3:
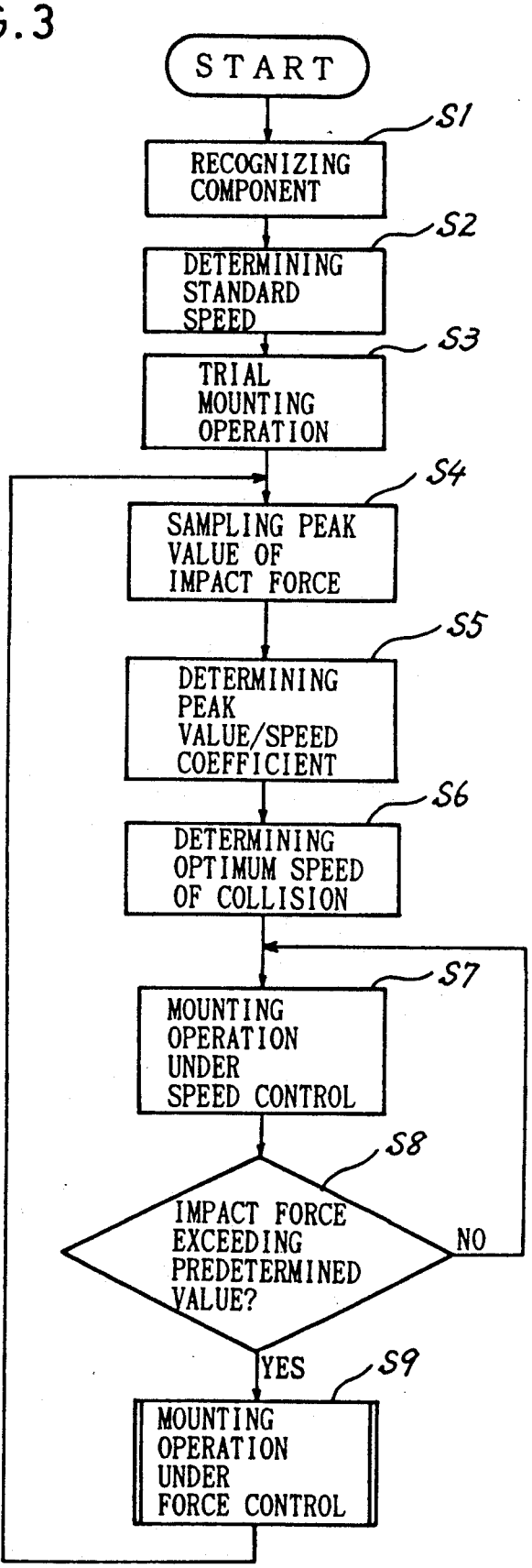
FIG. 3 is a flow chart showing a procedure for speed control.

In the speed control procedure of the present embodiment, the electronic component 3 held by the suction head assembly 4 is lowered onto the printed board 31 at a controlled constant speed at least after the component has approached the board 31. FIG. 3 shows this speed control procedure.

First in step S1, the microcomputer 1 recognizes the type of electronic component held by the suction head assembly 4 with reference to the data stored in the computer in advance. In step S2, the microcomputer determines for the particular type of component a standard lowering speed which is unlikely to cause damage or break due to the possible impact force.

In the next step S3, the component is actually mounted on the printed board at the standard lowering speed. In step S4, the peak value of resulting impact force is sampled from the detection signal afforded by the force sensor.

Figure 11:
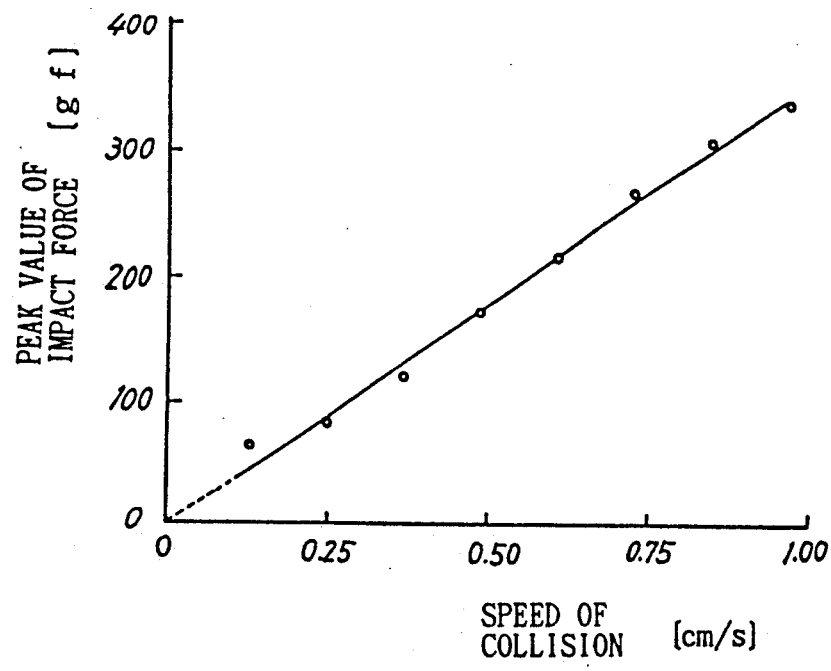
FIG. 11 is a graph showing the relationship between the speed of collision and the peak value of impact force.

FIG. 11 is a graph showing a plurality of samples obtained. It is seen that there is a linear relation between the peak value of impact force and the speed of collision. Accordingly, the slope of the straight line in FIG. 11, i.e., the coefficient of peak value of impact force/lowering speed, can be determined from the sampling data obtained in step S4.

The coefficient of the peak value/lowering speed is therefore determined in step S5 as shown in FIG. 3. In step S6, an optimum collision speed slightly lower than a value corresponding to the permissible limit of impact force to be exerted on the component to be mounted is determined based on the coefficient, and a control signal is prepared for realizing the speed of rotation of the motor in accordance with the collision speed. The signal is fed to the D/A converter. As a result, the suction head assembly lowers, causing the electronic component to collide with the printed board.

At this time, step S8 inquires whether the rising value of impact force produced by the collision has exceeded a predetermined value. When the inquiry is answered in the affirmative, the sequence proceeds to step S9, wherein the speed control procedure is changed over to the force control procedure to be described below.

Force Control

The electronic component 3 placed on the surface of the printed board 31 by the speed control procedure is further pressed against the board 31 and completely mounted thereon by the force control procedure, wherein the motor 51 is subjected to feedback control with reference to a rising waveform of pressure set in the microcomputer 1 in advance as a desired value so that the pressure to be exerted on the component 3 is regulated to not higher than the specified value.

Figure 2:
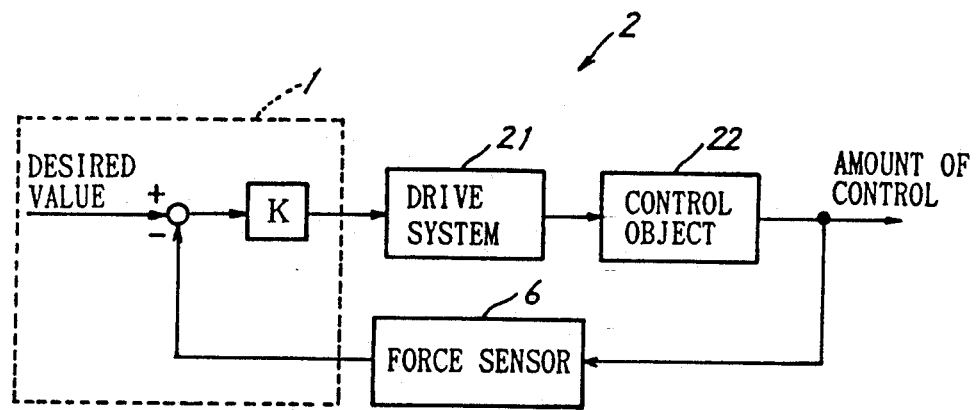
FIG. 2 is a control block diagram showing a force control system.

FIG. 2 shows a feedback control system for the force control procedure.

The microcomputer 1 has stored therein the change of pressure rising in the form of a step to the desired value, and the deviation of the pressure detected by the force sensor 6 from the desired value is fed to a drive system 21 including the motor 51. The pressure obtained from the object 22 to be controlled which includes the electronic component and the printed board is detected by the force sensor 6 and fed back to the microcomputer 1.

Figure 12:
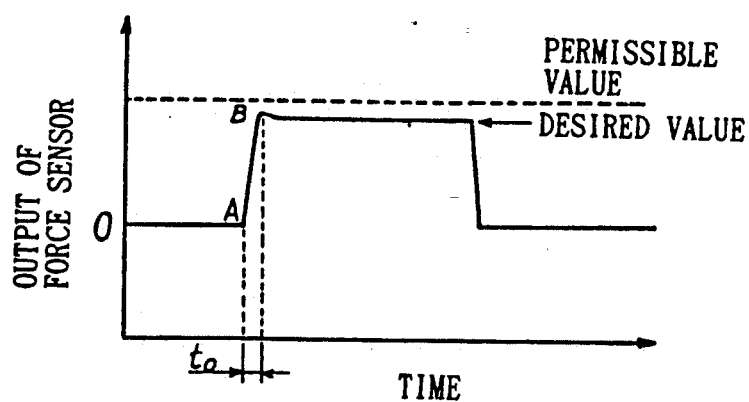
FIG. 12 is a waveform diagram of the output of a pressure sensor under force control.

FIG. 12 shows the waveform of output of the force sensor in the force control procedure.

The output of the force sensor rises upon the contact of the component held by the suction nozzle assembly with the printed board and thereafter increases toward the desired value to exhibit a peak. During the period t0 from a time point A at which the sensor output starts to rise to a time point B at which the peak occurs, the output of the force sensor is fed to the microcomputer with a sufficiently short sampling period, and a control signal is prepared in real time in accordance with the deviation of the output from the desired value and fed to the head lift mechanism.

Consequently, no great peak occurs in the force sensor output, and the maximum pressure to be exerted on the component is regulated to not higher than the permissible value.

The electronic component is thereafter pressed against a solder paste layer on the printed board under proper pressure in match with the desired value for surface mounting.

When to terminate the force control operation can be determined suitably, for example, by causing the pressure pattern serving as the desired value to be output by the microcomputer to fall to zero at a suitable position as seen in FIG. 12, or by measuring elapsed time from the start time point A or peak time point B and reversely rotating the lift motor 51 upon lapse of a predetermined length of time.

The force control operation is conducted also when the suction head assembly 4 attracts components to prevent the component from being damaged or broken by the pressure of the suction nozzle.

After the electronic component has been completely mounted, the next component is mounted by repeating the same process as above.

Figure 9:
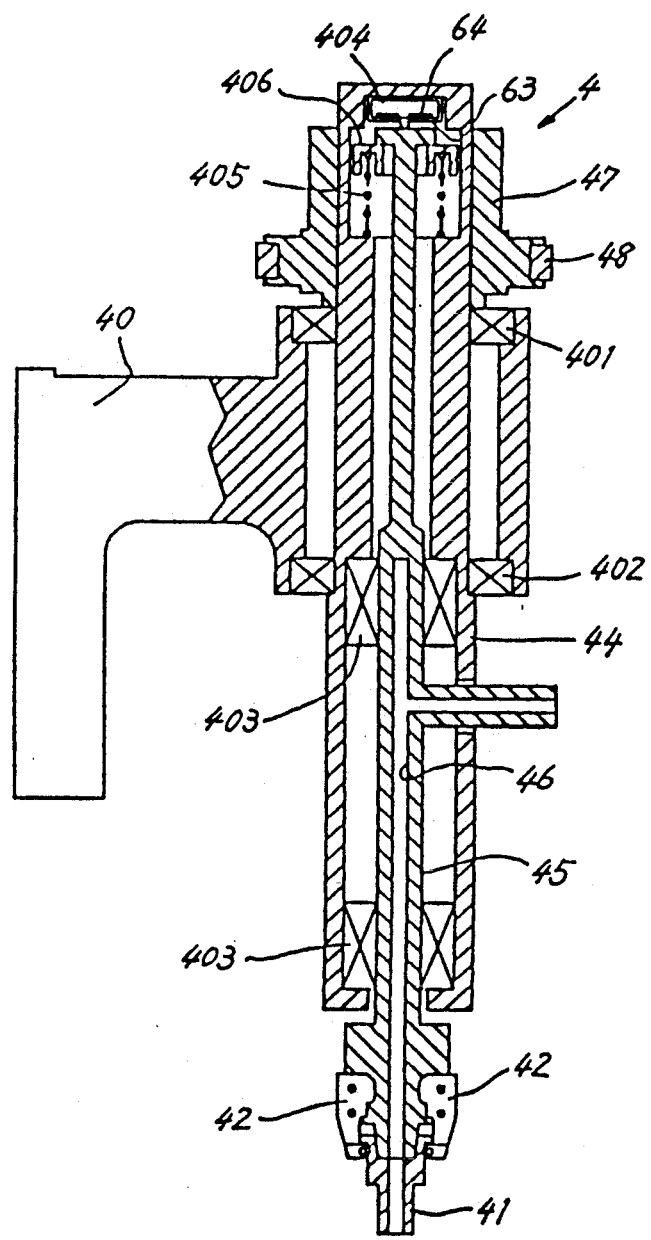
FIG. 9 is a sectional view of another example of suction head assembly.

FIG. 9 shows another example of suction head assembly 4.

The same outer tube 44 as above is provided at its upper end with a drum member 404 having a lower open end, to which a disklike spring member 63 is fastened. Strain gauges 64 are affixed to a surface of the spring member 63. Arranged inside the outer tube 44 are a coiled spring 405 and a pressure member 406 for biasing the upper end of an inner tube 45 toward the other surface (rear surface) of the spring member 63 by the spring 405.

With the suction head assembly, the strain gauges 64 is preloaded with the biasing force of the coiled spring 405.

Accordingly, the pressure on electronic components needs to be calculated by subtracting the force of the coiled spring 405 from the pressure detected by the strain gauges 64, or to be measured with the force of the spring 405 taken as a reference point (zero point).

The strain gauges 62, 64 are not limited to those comprising a common metal resistance wire but can be semiconductor strain gauges.

Figure 10:
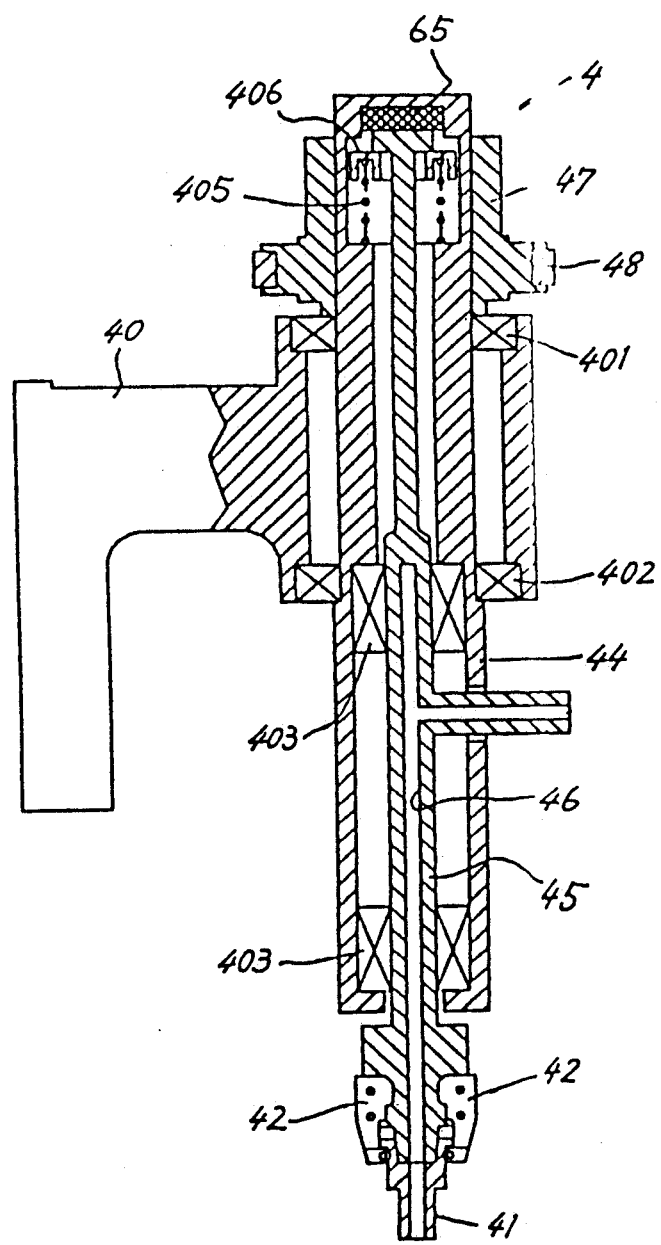
FIG. 10 is a sectional view of another example of suction head assembly.

FIG. 10 shows another example of suction head assembly 4, in which a piezoelectric element 65 is interposed between the outer tube 44 and the inner tube 45 in place of the strain gauges of FIG. 9 to serve as a force sensor.

The piezoelectric element 65 is made of a piezoelectric material such as quartz or trioxide [Pb(Ti·Zr)O₃] and produces a potential in accordance with an external force acting thereon. Accordingly, the pressure acting on electronic components can be detected by measuring the potential.

Alternatively, pressure-sensitive electrically conductive rubber is usable in place of the piezoelectric element 65. This rubber has the property of varying in resistance value when subjected to a load. The pressure on electronic components can be detected by measuring the variation in resistance value.

Figure 13:
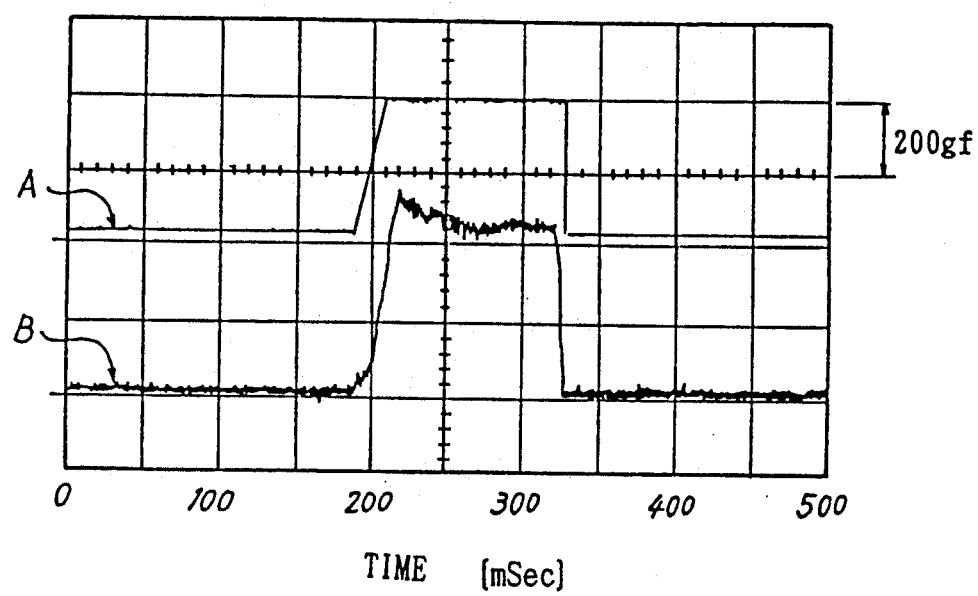
FIG. 13 is a waveform diagram showing the response of pressure to a ramplike waveform of desired value under force control.
Figure 14:
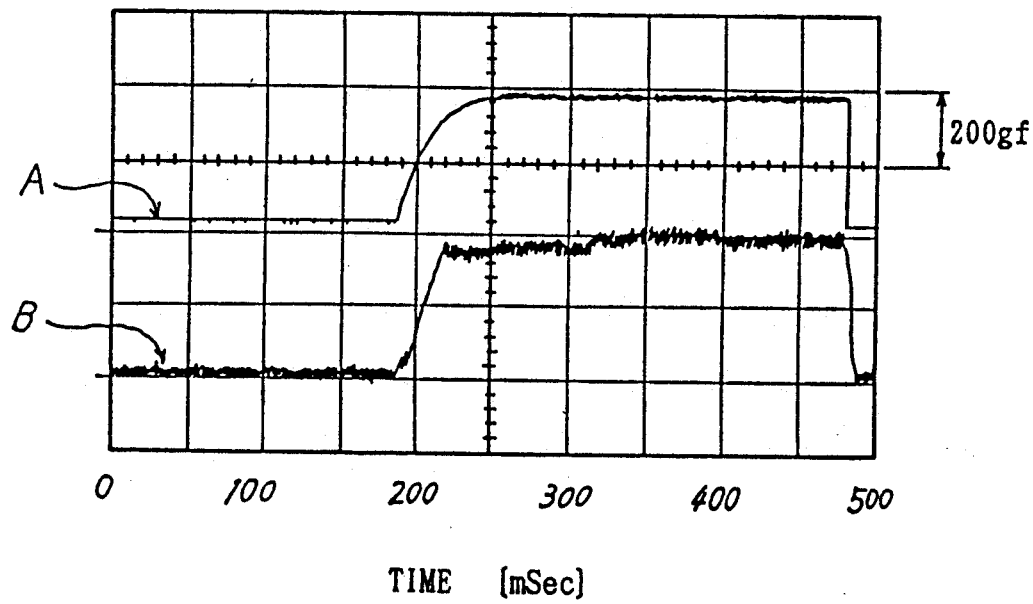
FIG. 14 is a waveform diagram showing the response of pressure to a first-order lag waveform of desired value under force control.

The desired value of pressure need not always have a waveform rising in the form of a step but can be a ramplike waveform A as shown in FIG. 13 or of a waveform A of first-order lag as seen in FIG. 14. These waveforms are useful especially when the electronic component and the printed board are made of hard materials, such as ceramics, which are likely to permit marked overshooting if the steplike waveform is used.

The waveform B of FIG. 13 shows the response of pressure to the desired value of ramplike waveform A. The waveform B of FIG. 14 shows the response of pressure to the desired value of waveform A obtained by processing the desired value of waveform of FIG. 13 by a first-order lag filter.

In the case of the response waveform B of FIG. 13, overshooting upon rising is suppressed to a low level, followed by remarkably diminished variations. Further overshooting upon rising is completely eliminated from the response waveform B of FIG. 14.

The surface mounting apparatus described is adapted to apply a suitable pressure to electronic components, thereby ensuring a reliable and rapid surface mounting operation without the likelihood of damaging or breaking the component.

Although the speed of collision and the impact force are expressed in a linear relationship according to the foregoing embodiment, it is also effective to use polynominal approximation or like curved-line approximation depending on the construction of the apparatus for practicing the invention. It is further possible to sample the peak value of impact force every time pressure control is effected to accumulate a series of sampled data in the past and to determine the collision speed for the subsequent cycle based on the accumulated data.

External Force Measuring Circuit

With the electronic component mounting apparatus described above, it is likely that the suction head assembly 4 will start to lower from an abnormal position as shifted from above the specified mounting position, for example, owing to an error in the operation of the reciprocating device. It is then likely that while descending to the programmed specified mounting position at a high speed, the suction nozzle 41 will strike against other part or the like on the board to become damaged at the nozzle end.

To preclude such damage, it appears useful to monitor the output of the force sensor 6 and stop the operation of the reciprocating device in an emergency upon the sensor output exceeding a predetermined threshold value during the descent of the suction head assembly.

In the case of the suction head assembly 4, however, the holding head portion including the inner tube 45 and the suction nozzle 41 is vertically movable relative to the base portion including the support arm 40 and the outer tube 44, so that an inertial force acts on the holding head portion owing to acceleration and deceleration invoved in the descent of the head assembly, consequently producing a difference between the force measured by the force sensor 6 and the external force acting on the suction nozzle 41.

This entails the problem that monitoring the output of the force sensor 6 fails to realize an emergency stop as contemplated.

The present invention therefore provides an external force measuring circuit as will be described below for accurately measuring the external force acting on the suction nozzle to reliably prevent damage to or breakage of the suction nozzle.

The motor 51 shown in FIG. 1 is provided with an encoder 14 for detecting the speed of rotation of the motor. The encoder 14 produces pulses, which are counted by a counter 15 to detect the position of the suction head assembly 4 with respect to the height. The position data is fed to the microcomputer 1.

The microcomputer 1 has stored therein a program for preparing a motor control signal based on the displacement data from the A/D converter 13 and the position data from the counter 15. The motor control signal prepared is fed to the motor driver 12 by way of the D/A converter 11.

The operation to control the motor by the microcomputer comprises three procedures, i.e., position control for lowering the suction head assembly 4 at a high speed from a stand-by position above the component mounting position to a first control change-over position in the vicinity of the mounting position, speed control for lowering the head assembly 4 from the first control change-over position to a second control change-over position where the component collides with the board, and force control subsequent to the collision.

The speed control and force control procedures are the same as those previously described.

Position Control

Figure 15:
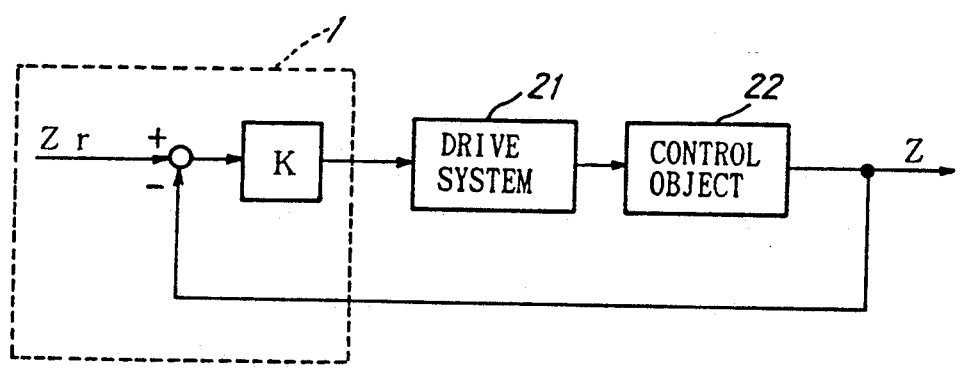
FIG. 15 is a control block diagram showing a position control system.

FIG. 15 shows a feedback control system for the position control procedure.

Figure 17A:
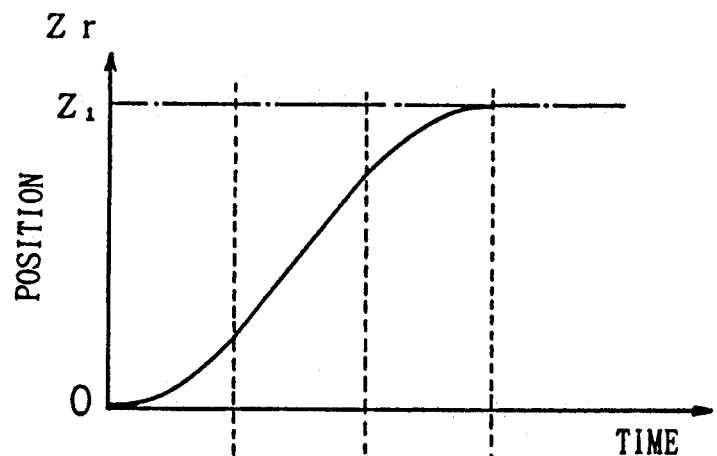
FIGS. 17, (a), (b) and (c) are graphs showing variations in the position, speed and acceleration of the suction head assembly, respectively.
Figure 17B:
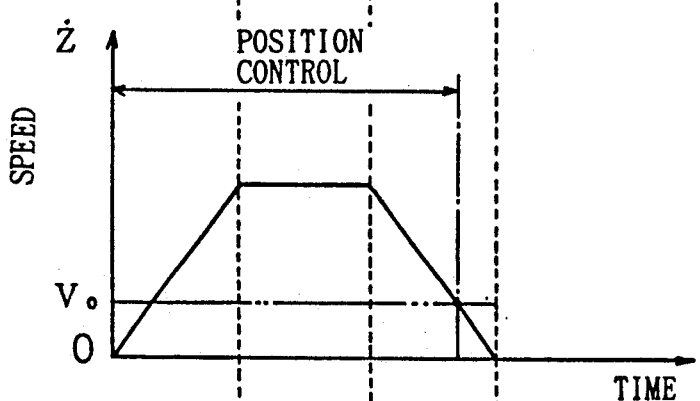
Figure 17C:
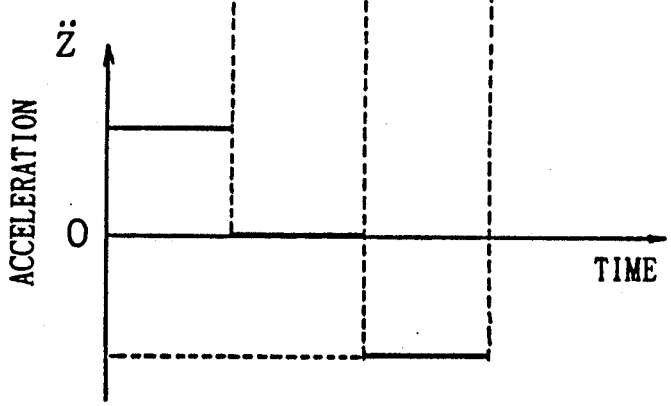

As shown in FIG. 17, (a), the microcomputer 1 has stored therein a smooth S-shaped curve extending to a final desired value Z1 and serving as a desired value Zr of altered position of the suction head assembly. The descending speed of the head assembly gradually increases initially for a predetermined period, then remains at a constant value and gradually decreases finally for a predetermined period, the speed thus varying in a trapezoidal form as shown in FIG. 17, (b). During this process, the acceleration of the head assembly changes stepwise as shown in FIG. 17, (c).

With reference to FIG. 15, the deviation of position data Z from the control object 22 including the counter from the desired value Zr of altered position is calculated by the microcomputer 1, which then prepares a motor control signal according to the calculated result and feeds the signal to the drive system 21 including the motor 51.

The position of the head assembly is controlled in the same manner as above also when it is driven upward after the component has been mounted on the board.

During the position control operation, the microcomputer executes an interrupt procedure as shown in FIG. 16 to prevent damage to the suction nozzle due to an operation error.

The output fs of the force sensor, i.e., the displacement data delivered from the strain gauges 62 is multiplied by the elastic modulus of the disklike spring member 61 to obtain force data, which is input to the microcomputer in step S1. The output of the counter 15, i.e., position data Z, is input to the computer in step S2, followed by step S3 in which a derivative of second order of the position data is computed to obtain acceleration data for the head assembly.

In the following step S4, the mass m of the inner tube 45, suction nozzle 41 and clamp arms 42, 42 is multiplied by the acceleration data to calculate the inertial force of the component holding head portion. In step S5, the inertial force is subtracted from the sensor output fs to calculate the external force (corrected value) actually acting on the suction nozzle.

Step S6 then inquires whether the corrected value has exceeded a predetermined threshold value F. If the inquiry is answered in the affirmative, the answer is interpreted as indicating occurrence of an operation error. Step S7 then follows to upwardly drive the suction head assembly.

The above procedure reliably prevents damage to the suction nozzle due to operation errors.

The position control operation is changed over to the speed control operation to be described below upon the descending speed of the head assembly matching a predetermined threshold value V0 during the deceleration processs.

Speed Control

For speed control, the force sensor measures the impact force produced by an actual mounting operation, and the microcomputer analyzes the correlation between the speed of collision and the impact force from the data of measurement and determines from the correlation the speed at which the subsequent collision is to take place.

The speed of collision which produces the impact force to be measured first is set to a suitable value in advance according to the type of components to be mounted so that the impact force will be sufficiently lower than a permissible limit of impact force.

Since the collision speed and the impact force are generally in a proportional relation, the coefficient of proportion of the speed to the force can be determined from the measurement data (as to the collision speed and impact force) obtained at at least one point.

For the subsequent mounting operation, therefore, a suitale collision speed in accordance with the limit of impact force which will not damage components is determined based on the coefficient of proportion obtained by the first mounting operation or on a coefficient of proportion obtained from data accumulated by cycles of mounting operation.

The collison speed thus determined is used for determining the threshold value V0 of the descending speed for use in the foregoing position control procedure.

Force Control

The electronic component 3 placed on the surface of the printed board 31 by the speed control procedure is further pressed against the board 31 and completely mounted thereon by the force control procedure, wherein the motor 51 is subjected to feedback control with reference to a rising waveform of pressure set in the microcomputer 1 in advance as a desired value so that the pressure to be exerted on the component 3 is regulated to not greater than the specified value.

The rising waveform of pressure to be used is a ramplike or first-order lag waveform of pressure gradually increasing toward a final desired value. The force to which the component is subjected is measured by the force sensor. The motor 51 is driven in accordance with the deviation of the measurement from the desired value.

Figure 18A:
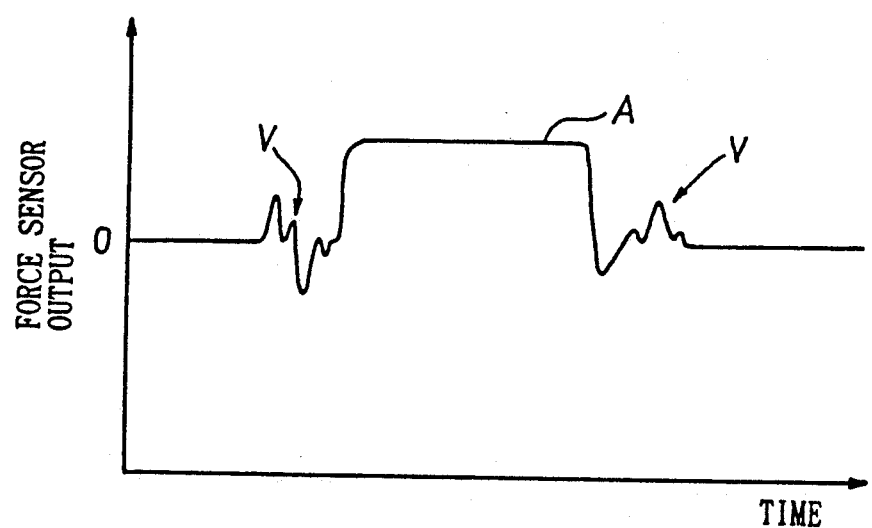
FIGS. 18, (a) and (b) are waveform diagrams prespectively showing the output of the force sensor and a corrected external force as obained under position control.
Figure 18B:
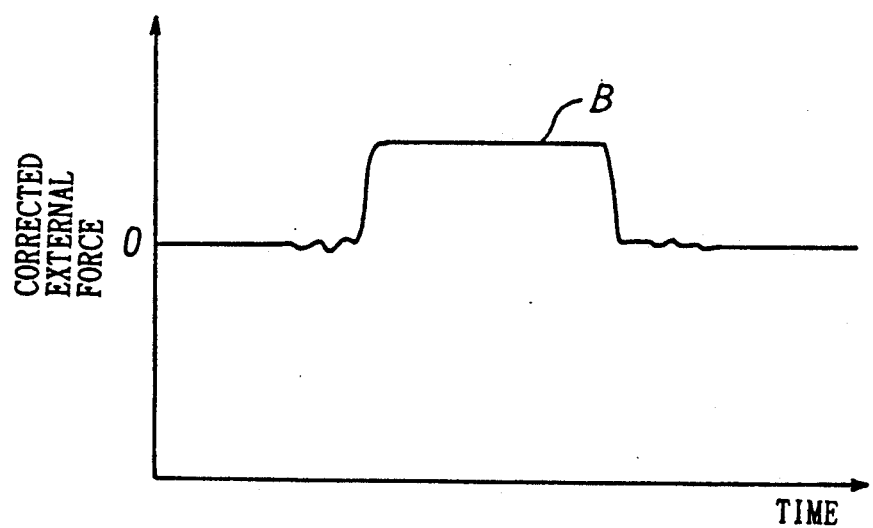

For comparison, FIGS. 18, (a) and (b) show the output waveform A produced by the force sensor when an electronic component is mounted on a board under the position control, speed control and force control described above, and the waveform B of external force obtained by the correction process according to the invention, respectively.

The variations V due to changes in acceleration and appearing in FIG. 18, (a) are eliminated in FIG. 18, (b). Accordingly, damage to the nozzle due to operation errors can be reliably prevented by monitoring the corrected external force.

Although the acceleration of the suction head assembly 4 in its entirety is regarded as approximately the same as the acceleration of the component holding head portion including the suction nozzle 41 in the case of the above embodiment, it is also possible to calculate the accurate acceleration of the holding head portion based on the elastic modulus of the disk-like spring member 61, etc.

The corrected value of external force obtained by the position control operation can be utilized also for control purposes other than the prevention of damage to the suction nozzle due to operation errors.

Improvements in Suction Head Assembly

With the conventional apparatus for automatically mounting electronic components wherein a compression spring is used as the drive source for the suction head assembly, the spring contracts when the component held by the suction nozzle is mounted on a board, so that the component is depressed against the board by the resulting repulsive force.

In this case, it appears possible to set the force to be exerted on the electronic component to a predetermined value by stopping the descent of the suction nozzle at a position where the amount of compression of the spring as measured reaches a specified value so that the component can be properly mounted on the board without being broken by the force exerted thereon by the board.

Nevertheless, the force actually acting on the component to be mounted differs from a value calculated from the amount of compression of the spring and from the predetermined value owing to the sliding friction acting on the suction nozzle and to the influence of dimensional variations of the component and the board.

Moreover, the impact force to which the electronic component is subjected the momemt it strikes against the board can not be measured from the amount of compression of the spring.

Consequently, there arises the problem that the actual acting force damages or breaks the component when exceeding the predetermined value or permits the component to be mounted improperly if smaller than the predetermined value.

The present invention therefore provides improved suction head assemblies as will be described below.

Figure 19:
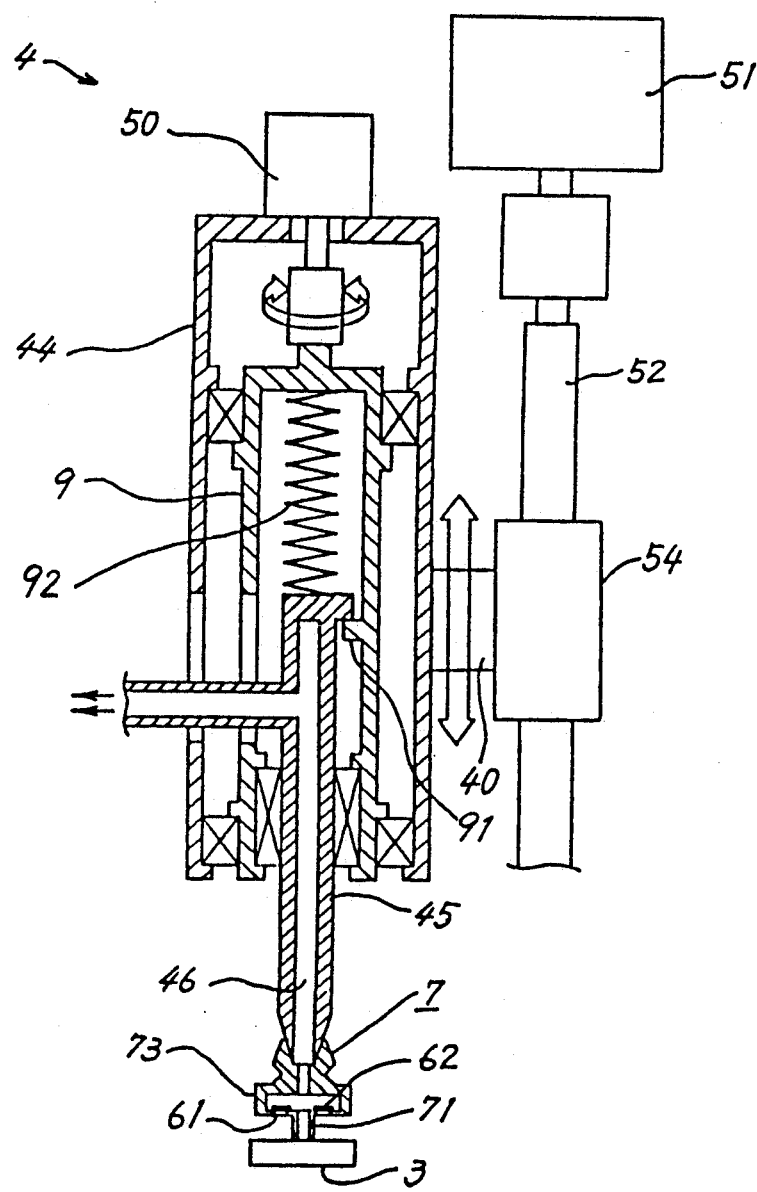
FIG. 19 is a sectional view showing an improved suction head assembly.

FIG. 19 shows a suction head assembly 4 which comprises an outer tube 44 vertically supported by a support arm 40, and an intermediate tube 9 disposed inside the outer tube 44 and rotatable about a vertical axis.

Mounted on the upper end of the outer tube 44 is a servomotor 50 for adjusting the orientation of an electronic component 3 held by the assembly. The shaft of the motor is connected to the intermediate tube 9.

An inner tube 45 having a center bore 46 is disposed inside the intermediate tube 9 in engagement therewith so as to be movable upward and downward over a predetermined distance but not to be rotatable relative to the tube 9. The distance of upward and downward movement of the inner tube 45 is defined by a stopper 91 projecting from the intermediate tube 9.

A compression spring 92 is provided between the intermediate tube 9 and the inner tube 45 for biasing the inner tube 45 downward.

The center bore 46 of the inner tube 45 is in communication with an unillustrated vacuum pump. Attached to the lower end of the inner tube 45 is a suction nozzle piece 7 for holding the electronic component 3 thereto by suction.

Figure 20:
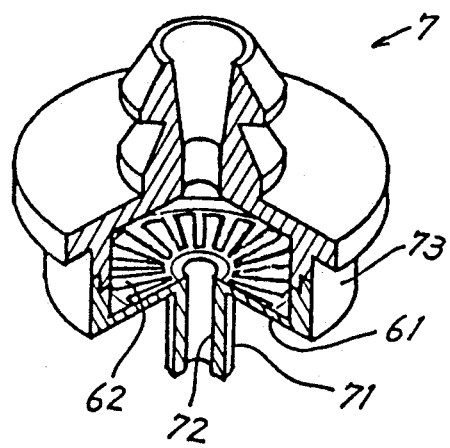
FIG. 20 is a perspective view partly broken away and showing a suction nozzle piece for use in the suction head assembly.

As shown in FIG. 20, the suction nozzle piece 7 has a drum portion 73 formed with an open lower end, to which a disklike spring member 61 is secured. A nozzle 71 having a center channel 72 projects downward from the center portion of the spring member 61. Strain gauges 62 are affixed to a surface of the spring member 61, constituting a force sensor for measuring the force to be exerted on the electronic component by a board.

With the above apparatus for automatically mounting electronic components, a strain sensor comprising the strain gauges 62 is provided directly on the suction nozzle piece 7 or directly on the lower end of the inner tube 45 having the nozzle piece 7 attached thereto, so that the impact force and pressure to be exerted on the component 3 can be accurately detected from the output of the strain sensor without being influenced by a friction force involved in the sliding movement of the inner tube 45 relative to the intermediate tube 9.

Accordingly, when the upward and downward movement of the suction head assembly 4 is controlled based on the output of the strain sensor, it is possible to prevent damage to the electronic component and mounting operation errors.

Figure 21:
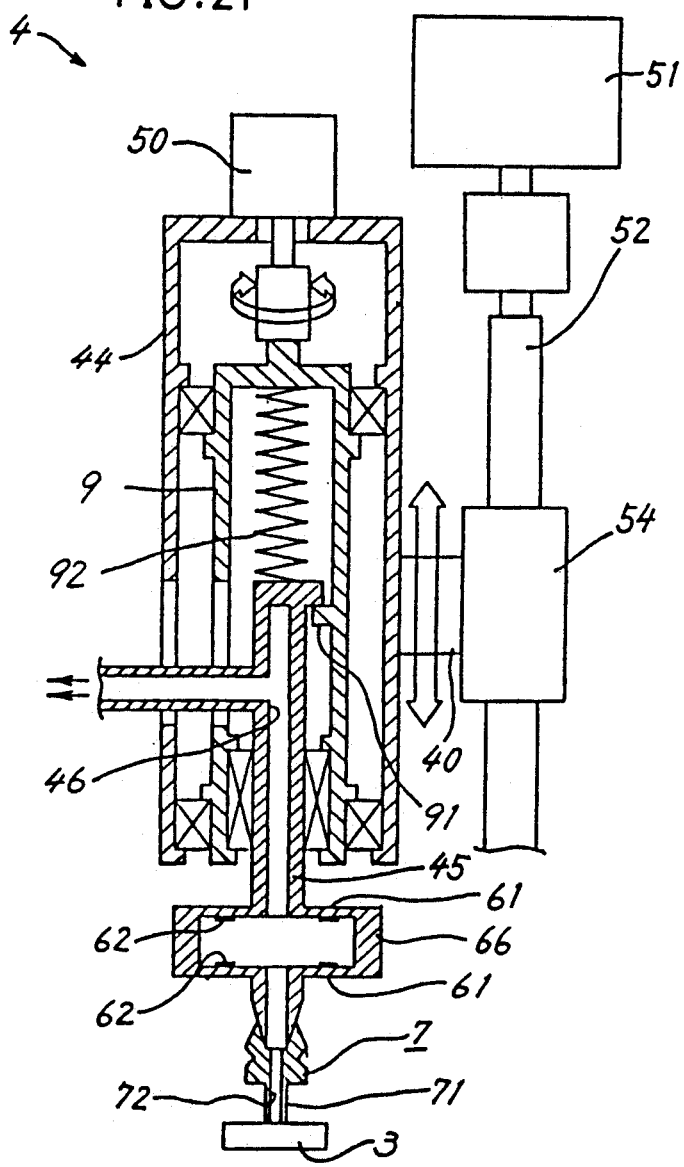
FIG. 21 is a sectional view of another example of improved suction head assembly.

FIG. 21 shows another example of suction head assembly 4, in which a force sensor is provided at a lower end portion of an inner tube 45. A drum portion 66 having a disklike spring member 61 attached to each of upper and lower open ends thereof is disposed at an intermediate portion of the inner tube 45, and strain gauges 62 are affixed to the inner surface of the spring member 61.

The electronic component automatic mounting apparatus having this suction head assembly 4 also has the same advantages as described above.

The embodiments described above are given for the illustration of the present invention and should not be interpreted as restricting the present invention as defined in the appended claims or reducing the scope thereof. Furthermore, the components of the present apparatus are not limited in construction to those of the foregoing embodiments but can of course be modified variously by one skilled in the art without departing from the spirit of the present invention as defined in the claims.

For example, the invention can be embodied as various apparatus for mounting parts or components, other than surface mounting apparatus, such as automatic assembling apparatus wherein robots are used.

What is claimed is:

1. An apparatus for mounting components by pressing the component as placed on a surface against the surface by a pressure mechanism to bond the component to the surface under pressure, comprising a pressure control system, wherein the pressure control system comprises means for setting a desired value of pressure to be exerted on the component; means for measuring pressure exerted on the component by an actual mounting operation; and drive control means for driving the pressure mechanism in accordance with the deviation of the measured value from the desired value of pressure.

2. The apparatus as defined in claim 1, further comprising a suction head assembly for holding an electronic component thereto by suction, and a reciprocating device for reciprocatingly moving the suction head assembly toward a printed board, wherein the reciprocating device includes the pressure mechanism.

3. The apparatus as defined in claim 1, wherein the desired value setting means sets the desired value setting means which is in one of a step-like waveform, a ramp-like and first-order lag waveform wherein rising pressure gradually increases toward a final desired value.

4. In an apparatus for mounting components by repeating the operation of moving the component as held to a reciprocating device toward a surface and mounting the component in position on the surface, an impact force control system for controlling the speed of collision of the component with the surface to regulate the impact force to be exerted on the component to not greater than a specified value, the system being characterized in that the system comprises means for measuring an impact force produced by an actual mounting operation, means for analyzing the correlation between the speed of collision and the impact force from the data of measurement, and means for determining the speed of subsequent collision based on the correlation.

5. In a component mounting apparatus comprising a reciprocating mechanism having an output portion and movable toward and away from a surface for mounting a component thereon, and a component holding mechanism attached to the output portion, the component holding mechanism having a base portion fixed to the output portion of the reciprocating mechanism, a component holding head portion coupled to the base portion and movable relative thereto in the direction of reciprocating movement, an elastic connecting portion connecting the base portion to the component holding head portion, and a displacement sensor provided between the base portion and the holding head portion for measuring the displacement of the base portion and the head portion relative to each other, an external force measuring circuit characterized in that the circuit comprises:

force detecting means for detecting the force to be exerted on the component holding head portion based on the output value of the displacement sensor and the elastic modulus of the elastic connecting portion, and arithmetic means for calculating an external force acting on the component holding head portion by subjecting the result of detection by the force detecting means to a correcting arithmetic operation taking account of at least the acceleration of the output portion of the reciprocating mechanism and the mass of the component holding head portion, while the component holding head portion of the holding mechanism approaches the surface.

6. An apparatus for automatically mounting electronic components characterized in that the apparatus comprises a reciprocating mechanism having an output portion and movable toward and away from a surface for mounting the component thereon, and a component holding mechanism attached to the output portion, the component holding mechanism comprising a base portion fixed to the output portion of the reciprocating mechanism, a movable portion in engagement with the base portion and movable relative thereto in the direction of reciprocating movement, a spring member provided between the base portion and the movable portion, a component holding head portion connected to the movable portion by an elastic support member elastically deformable toward the direction of reciprocating movement, and a strain sensor for measuring the amount of elastic deformation of the elastic support member.

* * * * *